United States Patent
Yamakawa et al.

(10) Patent No.: US 7,040,906 B2
(45) Date of Patent: May 9, 2006

(54) CONNECTION STRUCTURE BETWEEN BUS BARS AND RELAY TERMINALS

(75) Inventors: Shuji Yamakawa, Mie (JP); Eriko Yuasa, Mie (JP)

(73) Assignee: Sumitomo Wiring Systems, Ltd., Mie (JP)

(*) Notice: Subject to any disclaimer, the term of this patent is extended or adjusted under 35 U.S.C. 154(b) by 0 days.

(21) Appl. No.: 10/623,626

(22) Filed: Jul. 21, 2003

(65) Prior Publication Data
US 2004/0043645 A1 Mar. 4, 2004

(30) Foreign Application Priority Data
Sep. 2, 2002 (JP) .............................. 2002-256346

(51) Int. Cl.
*H01R 12/00* (2006.01)
(52) U.S. Cl. ............... 439/76.2; 439/936; 439/604; 439/276
(58) Field of Classification Search .......... 439/604, 439/606, 76.2, 83, 874, 722, 605, 949, 936, 439/276; 174/68.2
See application file for complete search history.

(56) References Cited

U.S. PATENT DOCUMENTS

| | | | | |
|---|---|---|---|---|
| 4,739,441 A * | 4/1988 | Galletly | ............... | 174/68.2 |
| 5,205,757 A * | 4/1993 | Hertelendy | ............ | 439/441 |
| 5,954,533 A * | 9/1999 | Hatagishi et al. | ...... | 439/397 |
| 5,993,256 A * | 11/1999 | Shimojyo | .............. | 439/604 |
| 6,261,117 B1 * | 7/2001 | LaCroix | ................ | 439/393 |
| 6,402,530 B1 * | 6/2002 | Saito et al. | ............ | 439/949 |
| 2002/0076955 A1 | 6/2002 | Murakoshi | | |

FOREIGN PATENT DOCUMENTS

JP  5-73859  10/1993

* cited by examiner

Primary Examiner—Tho D. Ta
Assistant Examiner—Felix O. Figueroa
(74) Attorney, Agent, or Firm—Oliff & Berridge, PLC

(57) ABSTRACT

A connection structure is between bus bars and relay terminals in an electrical connection box to be mounted on an automobile. Each bus bar is produced by punching an aluminum-based metal plate into a desired circuit configuration. An end of each bus bar is bent so that the end is connected to each respective relay terminal. Each bus bar end is welded to the respective relay terminal. Connection parts between the bus bars and the relay terminals are embedded in a molded insulation. Alternatively, grease is applied to and fills in exteriors and clearances of the connection parts.

4 Claims, 4 Drawing Sheets

CONNECTION STRUCTURE BETWEEN BUS BARS AND RELAY TERMINALS

CROSS-REFERENCE TO RELATED APPLICATIONS

The entire disclosure of Japanese Patent Application No. 2002-256346 filed on Sep. 2, 2002 including the specification, claims, drawings and summary is incorporated herein by reference in its entirety.

FIELD OF THE INVENTION

The present invention relates to a connection structure between bus bars and relay terminals. More particularly, the invention relates to bus bars made of a recyclable material that are arranged as internal circuits in an electrical connection box, such as a junction box or the like, to be mounted on an automobile.

BACKGROUND OF THE INVENTION

Heretofore, bus bars, produced by punching an electrical conductive material, are contained as internal circuits in an electrical connection box such as a junction box or the like.

For convenience of explanation, a conventional connection structure between bus bars and relay terminals will be described by referring to FIG. 3. FIG. 3 is an exploded perspective view of a conventional electrical connection box for an automobile.

As shown in FIG. 3, an electrical connection box 1 includes a casing with an upper casing member 2 and a lower casing member 5. Bus bars 4 and insulation plates 3 are alternately laminated on each other in the casing. An end of each bus bar 4 is bent to form a tab 4a. The tabs 4a penetrate a connector containing section 2a in the upper casing 2, a fuse containing section 2b, and a relay containing section 2c either directly or through intermediate terminals to connect with a connector C coupled to a wire harness W/H, a fuse F, and a relay R.

The bus bars 4, which constitutes the internal circuits, are made of a copper-based metal plate having high electrical conductivity. After punching the copper-based metal plate into the bus bars 4, having desired circuit configurations, a desired end of each bus bar 4 is bent to form a tab 4a.

Recent requirements encourage recycling of junked automobiles. Iron makes the highest percentage of an automobile. When junked automobiles are incinerated to recover and recycle iron, the required mixing rate of copper to iron should be less than 0.1%. This prevents the iron from being denatured due to a reaction with the copper.

Since the bus bars 4 are made of the copper-based metal plate, as described above, it is preferable to remove the bus bars 4 from the car body upon disassembly of the automobile and to separate the bus bars 4 from the iron based car body. However, the electrical connection box must be disassembled in order to take out the bus bars from the box. This work requires extensive manpower and is not practical.

To avoid interference during iron recovery, from a practical recycling standpoint, the bus bars should be formed from an aluminum-based metal which does not denatured the iron. However, since aluminum-based metal is low in hardness and stiffness, a mating relay terminal T tends to widen the tab 4a' provided with a press contact slot, as shown in FIG. 4. This lowers the reliability of the electrical connection. Also, a connection part between the bus bar 4', made of the aluminum-based metal, and the relay terminal T, made of the copper-based metal, will suffer from electric erosion if any water infiltrates the connection part.

SUMMARY OF THE INVENTION

In view of the above problems, it is an object of the present invention to provide a connection structure between bus bars and relay terminals that enhances automobile recyclability, electrical connection reliability and prevents electric erosion.

In order to achieve the above objects, the present invention provides a connection structure between bus bars and relay terminals. The connection structure is contained in an electrical connection box to be mounted on an automobile. Each of the bus bars is produced by punching an aluminum-based metal plate into a desired circuit configuration. An end of each bus bar is bent so that the end is connected to each relay terminals. Each bus bar is welded to each relay terminal. The welded connection parts, between the bus bars and the relay terminals, are embedded in a molded insulation resin.

According to the above structure, since the bus bars, made of the aluminum-based metal, are provided in lieu of conventional bus bars made of a copper-based metal, it is possible to reduce the copper to iron mixing rate which influences the iron-recovery during recycling of car bodies and enhances recyclability of junked automobile.

Also, since the connection parts between the bus bars and the relay terminals are embedded in the molded insulation resin, it is possible to firmly secure the bus bars and relay terminals to each other. Thus, the above structure does not include a press contact tab with a press contact slot that receives a relay terminal which is fitted into a conventional bus bar. Accordingly, it is possible to ensure an electrical connection between bus bars and relay terminals, even if the bus bars are made from an aluminum-based metal.

Furthermore, since the connection parts are embedded in the molded insulation resin, it is possible to prevent water from infiltrating the connection parts between the bus bars and the relay terminals. Accordingly, even if the connection parts are made of different kinds of metal, it is possible to prevent electric erosion.

Since aluminum does not react to denature an iron-based metal, which is a main material of a car body, it is possible to enhance recovery of the iron-based metal. In addition, the aluminum-based bus bars have rust-resistance characteristics, good workability, and provide a lightweight electrical connection box.

Also, the present invention provides a connection structure between bus bars and relay terminals that is contained in an electrical connection box to be mounted on an automobile. Each bus bar is produced by punching an aluminum-based metal plate into a desired circuit configurations. An end of each bus bar is bent to connect with the relay terminal. Each bus bar is welded to each relay terminal. Grease is applied to fill the exteriors and clearances of welded connection parts between the bus bars and the relay terminals.

The above structure provides the same effect as in the case where the connection parts are in the molded insulation resin. Since a method for filling and applying grease to the connection parts does not require a mold, it is possible to embed the connection parts at a cost lower than molded resin.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

Embodiments of a connection structure between bus bars and relay terminals in accordance with the present invention will be described below.

Figure 1:
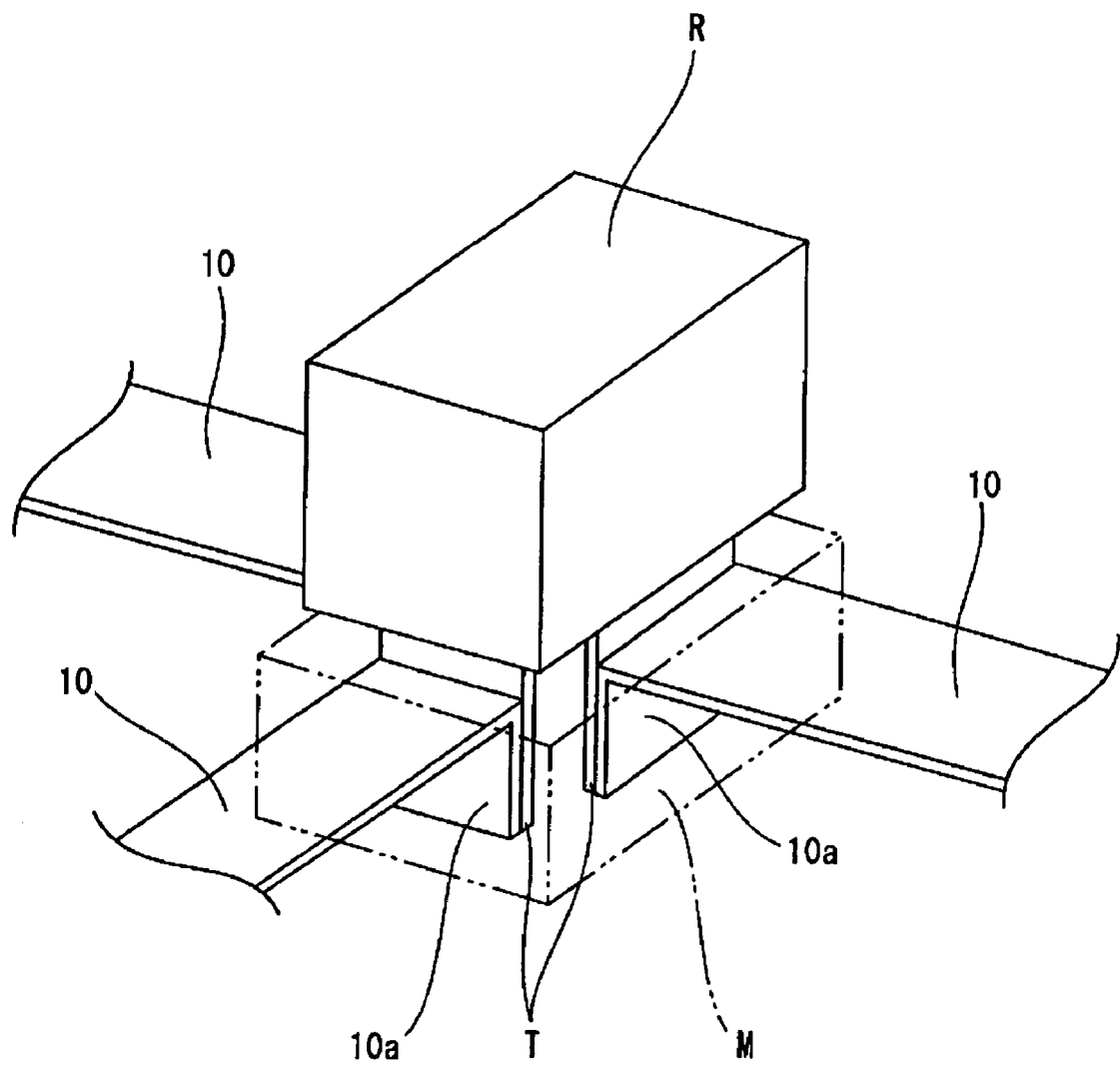
FIG. 1 is a perspective view of an embodiment of a connection structure between bus bars and relay terminals in accordance with the present invention.
Figure 2:
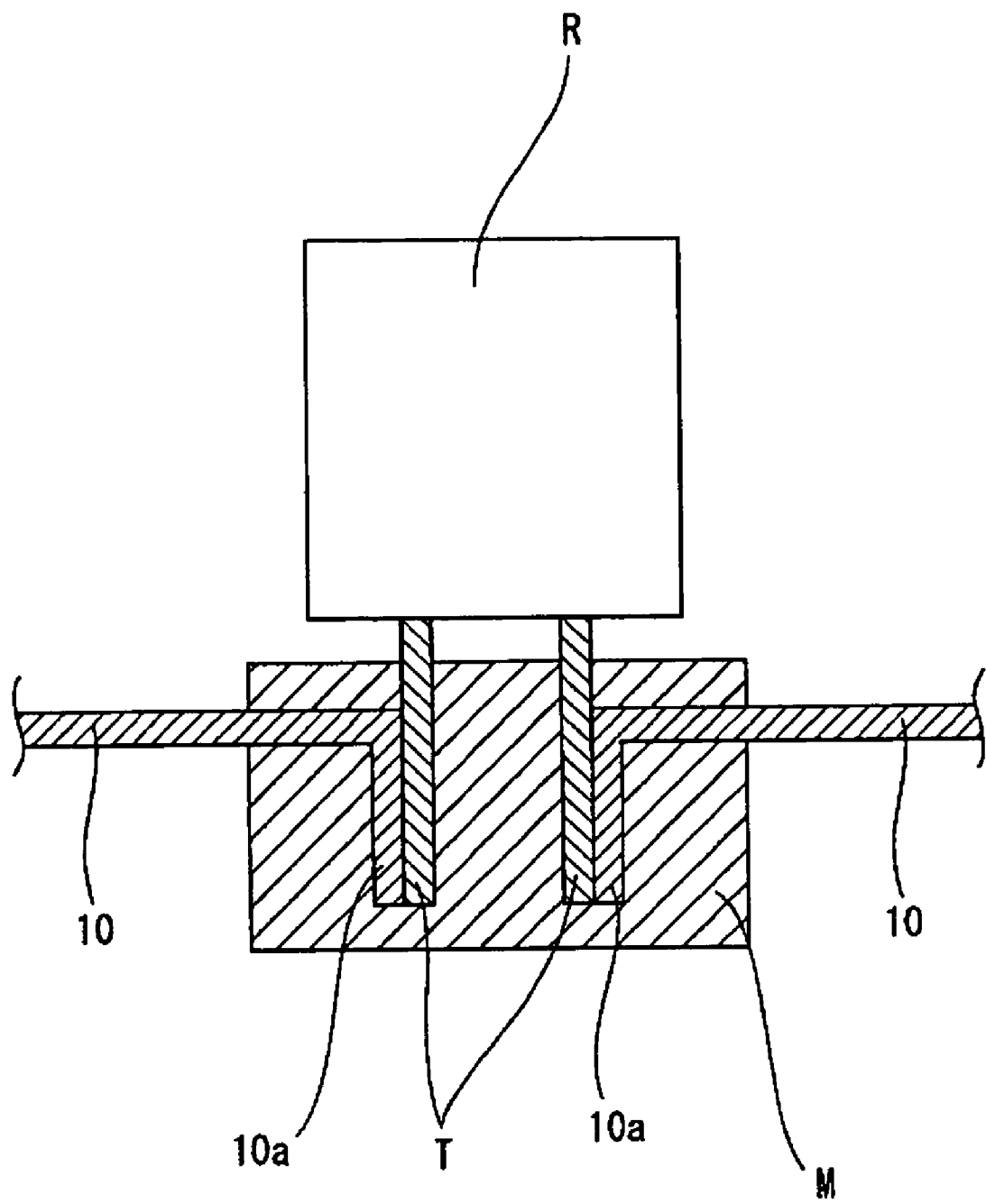
FIG. 2 is a schematic cross section view of the connection structure shown in FIG. 1.
Figure 3:
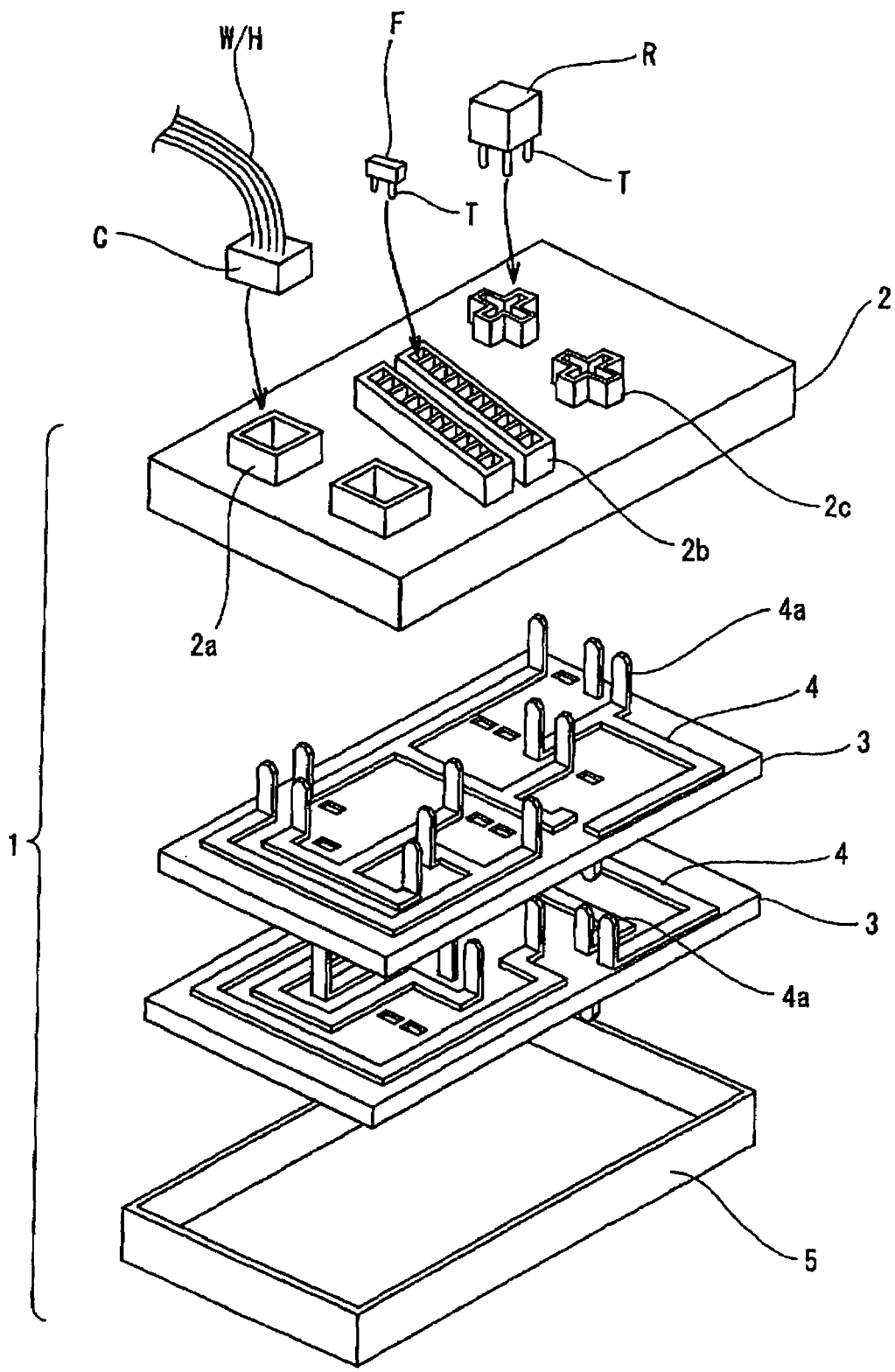
FIG. 3 is an exploded perspective view of a conventional electrical connection box for an automobile.
Figure 4:
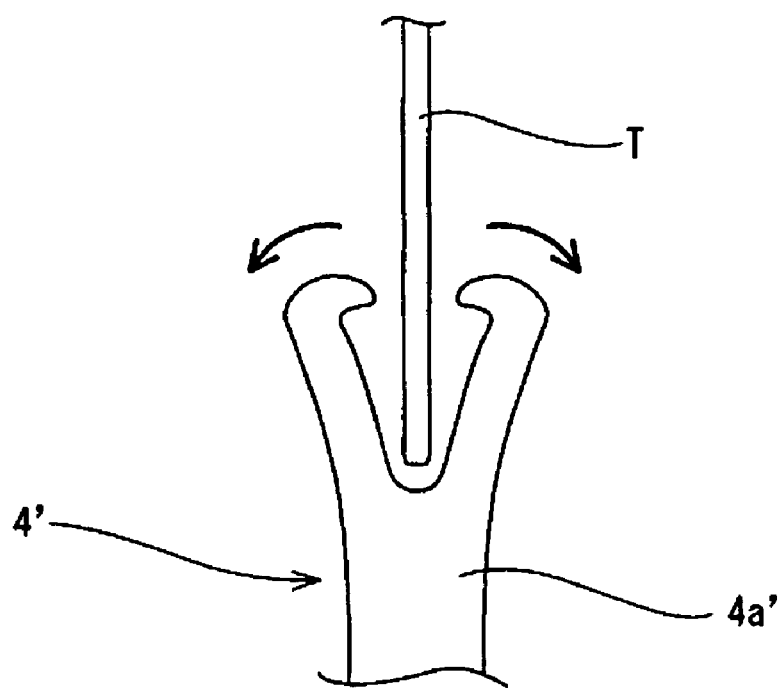
FIG. 4 is an explanatory view illustrating a problem in the electrical connection box shown in FIG. 3.

FIGS. 1 and 2 show an embodiment of the connection structure in accordance with the present invention. Bus bars 10 shown in FIG. 1 are disposed on insulation plates 3 as internal circuits in the electrical connection box 1 for an automobile, shown in FIG. 3. Each bus bar 10 includes a flat plate circuit body produced by punching an aluminum plate in desired circuit configurations. An end of each flat plate circuit body is bent down to form a tab 10a. The bus bar 10 may be made of not only pure aluminum but also an aluminum alloy, such as Al—Mg, Al—Mn, Al—Mg—Si, Al—Zn—Mg, Al—Si, or the like. Conductivity of pure aluminum is 60% of that of copper while conductivity of an aluminum alloy is 30% of copper. It is thus preferable to use pure aluminum from a conductivity standpoint.

Three relay terminals T made from brass having a copper-based metal, project from the relay R. Each bus bar 10 is welded to each relay terminal T. The relay terminals T and bus bars 10 are welded by melting their contact surfaces by an ultrasonic wave.

Furthermore, three welded portions are embedded in a molded resin to from a molded section M. The relay terminals T project from an upper surface of the molded section M while each bus bar projects from each side surface of the molded section M.

According to the above structure, the bus bars 10, made of the aluminum-based metal, can reduce the mixing rate of copper to iron during recovery of the iron during recycling of a car body, thereby enhancing recyclability of junked automobiles.

Since the welded portions between the relay terminals and the bus bars 10 are embedded in the molded insulation resin, it is possible to firmly secure the terminals T and bus bars 10 to each other. Thus, since the above structure does not fit the relay terminals in press contact tabs of the ends of the bus bars, as constructed in the prior art, it is possible to ensure the connection between the bus bars 10 and relay terminals T to each other, even if the bus bars are made of an aluminum-based metal. Furthermore, since the molded section M prevents infiltration of water, it is possible to prevent electric erosion, even if the relay terminals T and bus bars 10 are made of different kinds of metals (copper-based metal and aluminum-based metal).

Since aluminum does not react to denature the iron-based metal, it is possible to enhance the recovery of the iron-based metal. In addition, the bus bars 10, made of the aluminum-based metal, have rust-resistance characteristics, good workability and provide a lightweight electrical connection box.

While the relay terminals and bus bars are embedded in the molded resin in the above embodiment, grease may be filled in and applied to clearances and exteriors of the connection parts. Also, while the relay terminals and bus bars are welded by ultrasonic wave welding in the above embodiment, laser welding, TIG welding, or resistance welding may be applied to the connection parts.

From the above description of the invention, one skilled in the art will perceive improvements, changes and modifications. Such improvements, changes and modifications that are within the skill of the art are intended to be covered by the appended claims.

What is claimed is:

1. A connection structure between bus bars and relay terminals in an electrical connection box to be mounted on an automobile, said connection structure comprising:
    each bus bar produced by punching an aluminum-based metal plate into a desired circuit configuration;
    an end of each of said bus bars is bent so that each end is connected to a respective one of said relay terminals;
    a bus bar is welded to each respective relay terminal; and
    welded connection parts between said bus bars and said relay terminals are embedded in a molded insulation resin,
    wherein at least one of said relay terminals is made of a conductive material different from that of the bus bar.

2. A connection structure according to claim 1, wherein the at least one of said relay terminals is made of a copper-based metal.

3. A connection structure between bus bars and relay terminals in an electrical connection box to be mounted on an automobile, said connection structure comprising:
    each bus bar produced by punching an aluminum-based metal plate into a desired circuit configuration;
    an end of each of said bus bars is bent so that each end is connected to a respective one of said relay terminals;
    a bus bar is welded to each respective relay terminal; and
    grease is applied to and surrounds the welded connection parts between each said bus bars and said relay terminals,
    wherein at least one of said relay terminals is made of a conductive material different from that of the bus bar.

4. A connection structure according to claim 3, wherein the at least one of said relay terminals is made of a copper-based metal.

* * * * *